US007422963B2

(12) United States Patent
Owens

(10) Patent No.: US 7,422,963 B2
(45) Date of Patent: Sep. 9, 2008

(54) METHOD FOR CLEAVING BRITTLE MATERIALS

(75) Inventor: Gary Owens, Atherton, CA (US)

(73) Assignee: Owens Technology, Inc., Reno, NV (US)

( * ) Notice: Subject to any disclaimer, the term of this patent is extended or adjusted under 35 U.S.C. 154(b) by 0 days.

(21) Appl. No.: 11/144,465

(22) Filed: Jun. 2, 2005

(65) Prior Publication Data

US 2005/0287768 A1 Dec. 29, 2005

Related U.S. Application Data

(60) Provisional application No. 60/576,888, filed on Jun. 3, 2004.

(51) Int. Cl.
*H01L 21/461* (2006.01)

(52) U.S. Cl. .................... 438/458; 225/5; 257/E21.237

(58) Field of Classification Search ..................... 225/4, 225/5

See application file for complete search history.

(56) References Cited

U.S. PATENT DOCUMENTS

| | | | | |
|---|---|---|---|---|
| 3,901,423 | A | 8/1975 | Hillberry et al. | |
| 4,184,472 | A * | 1/1980 | Benedicto et al. | 125/23.01 |
| 4,244,348 | A | 1/1981 | Wilkes | |
| 4,343,287 | A | 8/1982 | Hallberg et al. | |
| 4,628,151 | A | 12/1986 | Cardas | |
| 4,955,357 | A | 9/1990 | Takeguchi et al. | |
| 4,980,517 | A | 12/1990 | Cardas | |
| 5,335,282 | A | 8/1994 | Cardas | |
| 5,593,815 | A * | 1/1997 | Ahn | 430/321 |
| 5,918,587 | A | 7/1999 | Hasegawa | |
| 6,007,916 | A * | 12/1999 | Satoh et al. | 428/408 |

FOREIGN PATENT DOCUMENTS

JP 11284278 A * 10/1999

OTHER PUBLICATIONS

Hiroshi Koizumi, "Device and Method for Manufacturing Laser Diode," English Translation of JP 11-284278 A, JPO, Oct. 1999.*

Krejcik, P., et al., "A Method of Cleaving Extremely Thin Crystals", Apparatus and Techniques, J. Phys. E: Sci Instrum., vol. 14, 1981, pp. 919-920.

* cited by examiner

*Primary Examiner*—Stephen W Smoot
(74) *Attorney, Agent, or Firm*—Dorsey & Whitney LLP

(57) ABSTRACT

An apparatus for cleaving a section of a bar of brittle material is provided. The apparatus comprises a support adapted to hold the section of the bar in a position to be cleaved, a blade, an actuator coupled to the blade for driving the blade at least partially through the bar to create a cleaved portion of the bar, and a follower for engaging the end of the bar during cleaving. An method of cleaving a section of a bar of brittle material is also provided. The method comprises initiating a crack in the bar and driving a blade through the bar to remove a portion of the brittle material from the end of the bar. In one embodiment, the blades drives through the bar at a controlled speed.

37 Claims, 9 Drawing Sheets

METHOD FOR CLEAVING BRITTLE MATERIALS

TECHNICAL FIELD

The present invention relates generally to cleaving, and more particularly, to methods and apparatuses for cleaving brittle materials into thin sections.

BACKGROUND

Thin flat "wafers" of semiconductor and similar materials are useful for photovoltaics and other solid-state electronics, and substrates for various systems such as microelectromechanical system (MEMS). Currently they are usually derived from sawing a boule or cast block of material and then polishing the resulting slices. The sawing process results in a great deal of waste and is costly. This high cost limits the market for certain products, such as photovoltaic systems. The conventional techniques of grinding and polishing crystals to obtain thin sections introduces defects and impurities to the crystal. Alternative methods of creating thin sections by additive processes have not proven to result in high quality material. Methods devised to date for cleavage into thin sections, that is gluing on an extension to the crystal, are only good for very small sections, and are cumbersome and slow to remove the glue. One of the main issues in conventionally cleaving a very thin section is the very different behavior of the two pieces during cleaving. The main body of the crystal remains fairly rigid, but the thin section cannot resist as much force, so the cleavage blade veers sideways, breaking the thin section before a full cleave can be achieved.

Accordingly, there is a need for improved methods and apparatuses for cleaving brittle materials.

SUMMARY OF THE INVENTION

According to an aspect of the present invention, an apparatus for cleaving a section of a bar of brittle material is provided. The apparatus includes a support adapted to hold the section of the bar in a position to be cleaved, a blade, an actuator coupled to the blade for driving the blade at least partially through the bar to create a cleaved portion of the bar, and a follower for engaging the end of the bar during cleaving. A method for cleaving a bar of brittle material is also provided.

DETAILED DESCRIPTION OF PREFERRED EMBODIMENTS

Figure 1:
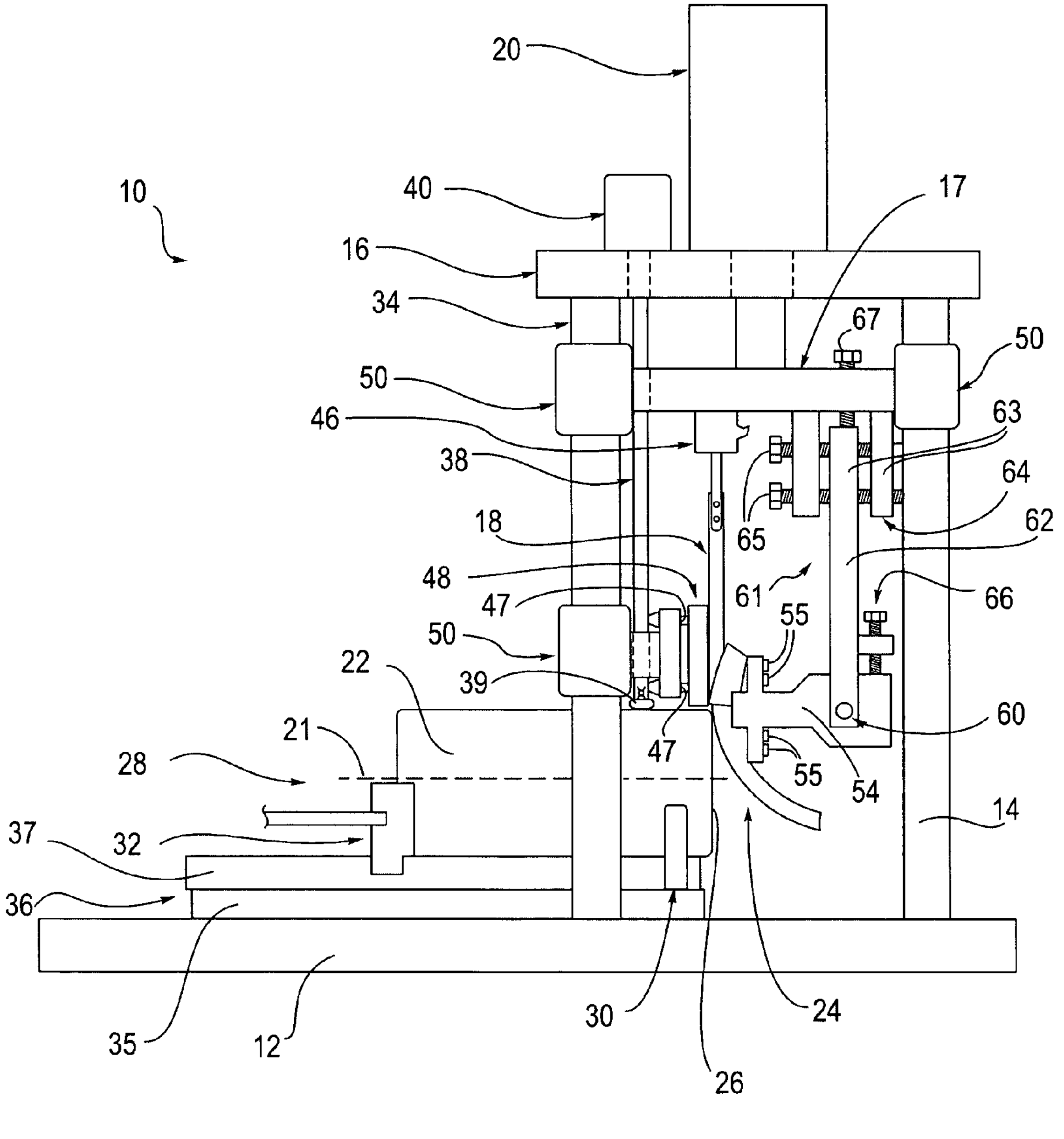
FIG. 1 is a side elevational view schematically illustrating an apparatus for cleaving brittle material in accordance with an embodiment of the present invention.

Various embodiments of the present invention are described hereinafter with reference to the figures. It should be noted that the figures are not drawn to scale and elements of similar structures or functions are represented by like reference numerals throughout the figures. It should also be noted that the text and figures are only intended to facilitate the description of specific embodiments of the invention. They are not intended as an exhaustive description of the invention or as a limitation on the scope of the invention. In addition, an aspect described in conjunction with a particular embodiment of the present invention is not necessarily limited to that embodiment and can be practiced in any other embodiments of the present invention.

An apparatus 10 in accordance with an embodiment of the present invention which can be used, for example, for cleaving a section of a bar of brittle material (see FIG. 1). Brittle materials, as used herein, generally refer to materials that can sustain only a small amount of deformation before breaking or fracturing. Silicon and other common semiconductor/substrate materials (such as gallium arsenide and sapphire) are usually hard and/or brittle. But, when in a single crystal form, thin sheets of these brittle materials are cleavable, and can be formed according to embodiments of the present invention. Accordingly, a "thin" sheet, or "thin" portion, as used herein, generally refers to a slice or piece of the brittle material thin enough to sustain an amount of deformation prior to fracturing that is larger than when the material in bulk. Generally, a wafer of silicon preferably less than 200 microns thick is a thin sheet according to embodiments of the present invention. Other embodiments of the invention can utilize a larger or smaller thickness of silicon. In some embodiments, a silicon wafer having a thickness between 50 and 200 microns is generated. Other thicknesses may also be generated in embodiments of the present invention.

Apparatus 10 includes a bottom support element or base 12 and an upstanding structure which includes a plurality of side frame elements 14 and a top platen 16. While not shown in FIG. 1 to avoid obscuring illustration of the invention, apparatus 10 may include a pair of microscopes to aid blade positioning and alignment. A flexible band, cable, or chain, or rack and pinion (not shown) may also be included in apparatus 10 to provide rotary to linear movement translation to drive the follower 24.

Figures 14A, 14B, 14C, 14D:
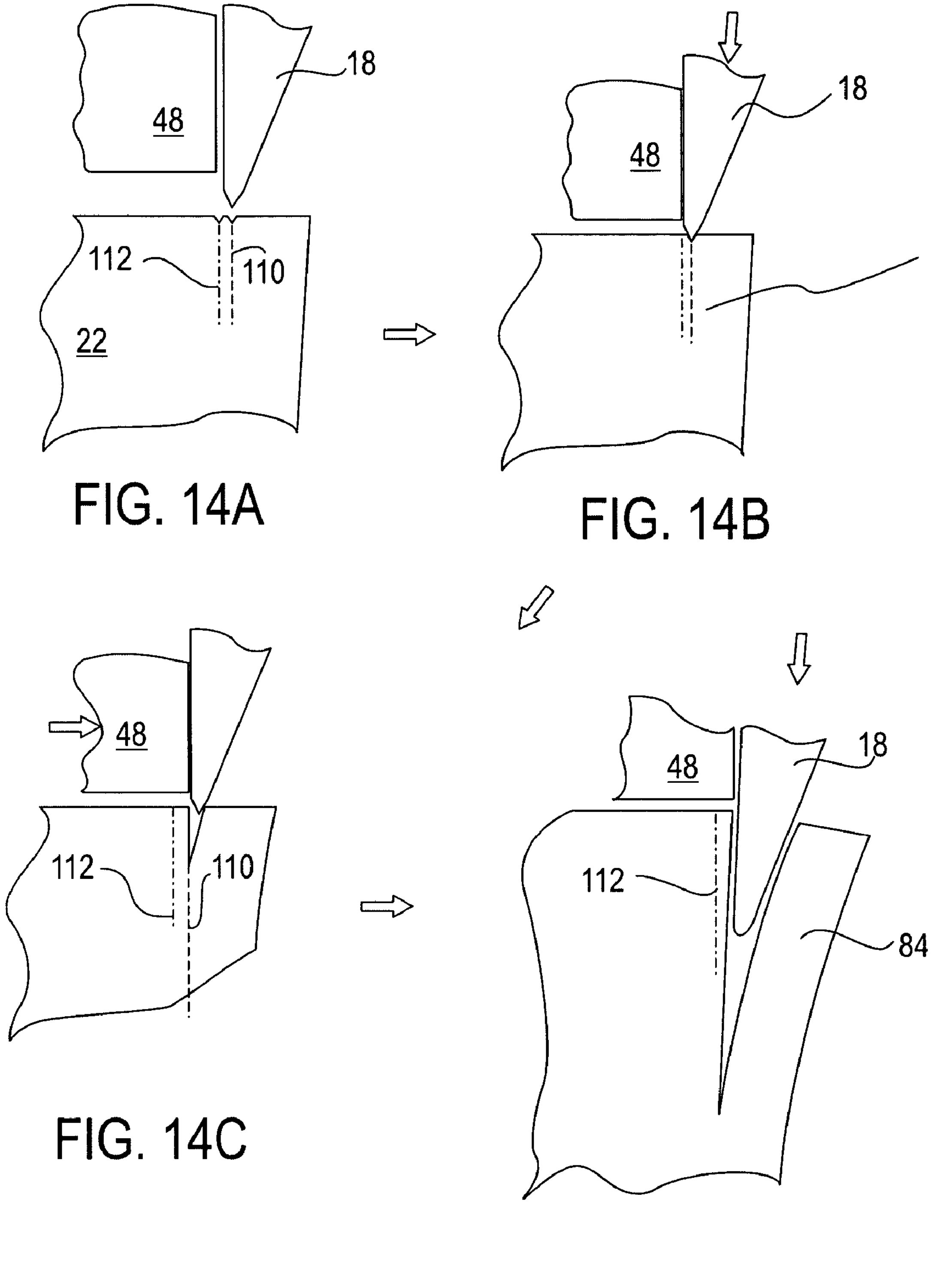
FIG. 14A schematically illustrates a blade and a backing plate for cleaving a bar of brittle material in accordance with a method of the present invention.
FIG. 14B schematically illustrates the initiation of the cleaving process in accordance with a method of the present invention.
FIG. 14C schematically illustrates the propagation of the crack initiated in the step illustrated in FIG. 14B in accordance with a method of the present invention.
FIG. 14D schematically illustrates the propagation of the cleaving process in accordance with a method of the present invention.

Apparatus 10 further includes a blade 18, an actuator 20 coupled to blade 18 for driving the blade at least partially through a bar or boule of brittle material 22 to create a cleaved portion of the bar, and a follower 24 for engaging the end 26 of bar 22 during cleaving. Apparatus 10 may include a pushing mechanism such as a pushrod 28 to feed the boule of brittle material 22. Any suitable actuator or motor, not shown, is coupled to the pushrod 28 for moving the boule 22 towards the cutting mechanism of apparatus 10. A guiding mechanism including a front guide 30, a rear guide 32, and a vertical guide 34 is provided to guide boule 22 into a position for cleaving. A fine adjustment slide 36 is provided, and the front guide 30 is preferably secured in one or more fixed positions of the slide 36 and the rear guide 32 is slidably mounted on the slide 36. Specifically, the fine adjustment slide 36 can adjust the position of boule 22 to establish a cut depth and, in some embodiments, adjust the blade position as the cut proceeds (see FIG. 14). Front guide 30 can be a part of fine adjustment slide 36. Rear guide 32 can be a part of boule pushing mechanism 28 and travel along fine adjustment slide 36. The fine adjustment slide 36 can be a linear motion stage including a stationary rail 35 coupled to the base 12 and a moveable rail 37 carried by and translatable relative to the stationary rail 35. The fine adjustment slide 36 provides a fine and final adjustment to the position of the boule 22 relative to the blade 18 after the boule 22 is fed by the pushrod 28 to a rough position. The fine adjustment slide 36 can be motorized and automatically controlled. A rod clamp pushrod 38 is coupled to a rod clamp actuator or motor 40 to firmly hold or clamp boule 22 down and in place on guides 30 and 32 and on slide 36. A pad 39 can be coupled to the lower portion of the rod clamp pushrod 38 for engaging the boule 22. Plate 17 is provided to support blade 18 and a follower adjustment assembly 64 to be described below. Plate 17 moves up and down on linear bearings 50.

Blade 18 is preferably sufficiently hard to resist excessive wear from cleaving operations. Preferably, blade 18 is sufficiently strong to avoid buckling under a cleaving load. By way of example, typical cleaving loads are around 3 to 5 newtons for a 10 mm wide cleave into a silicon plane. Exemplary materials suitable for cleaving brittle materials such as silicon include hardened tool steel with or without a TIN coating, zirconia, tungsten carbide and sapphire. Depending on the forces needed and the blade material strength, the thickness of the blade tip is typically on the order of 20 microns to avoid buckling.

In one preferred embodiment, blade 18 is a hollow-ground blade, as shown in FIGS. 1-6 and 15. It will be appreciated that blade 18 can be of any suitable form or shape such as V-shaped. As shown in greater detail in FIG. 15, hollow-ground blade 18 has a leading edge 42 and a concave curved surface 44 extending away from the leading edge 42. The concave curved surface 44 causes the cleaved materials to flex during cleaving. The curve of the concave curved surface 44 is selected to allow the brittle material to flex without breaking for a given thickness. The radius of the concave curved surface 44 depends on the strength of the material being cleaved and the thickness of the section being cleaved. Preferably, the concave curved surface 44 of blade 18 has an arc that approximates the arc of the convex curved surface 78 of follower 24 to be described below. The arc can extend across the entire bottom surface of blade 18 or extend a distance at least at long as the width of the slice to be cleaved. For example, a 65 micron thick silicon typically has a minimum radius of curvature of about 62 mm. The cutting surfaces of blade 18 may be treated, for example by permanent films or lubricants to reduce friction as the blade cleaves.

Actuator 20 is coupled to blade 18 for applying a force to blade 18 so as to drive the blade 18 toward and preferably entirely through the boule 22. A load cell 46 is coupled to actuator 20 to measure the force applied to blade 18. It is desirable to drive blade 18 in a slow and controlled manner to avoid damage to the blade and reduce the chances of an errant cleave. Hard, brittle materials such as silicon have considerable strain in them when they cleave, so their cleave velocity, that is the velocity at which a crack travels through the material, is close to the speed of sound or on the order of kilometers per second. However, when cutting thin sections, the strain in the thin section rapidly relaxes, limiting each individual cleave segment to a distance on the order of 1 mm. Thus to achieve a section of interest (on the order of 100 mm square), one needs to repetitively advance the crack. If the blade jumps ahead while cleaving, due to the sudden release of strain in the blade and material being cleaved, the blade may overload the slice/follower system, increasing the likelihood that the crack diverts through the slice, thus ruining the slice. Moving a blade in a slow, controlled manner is also desirable to match a follower position to be described in greater detail below.

Figure 2:
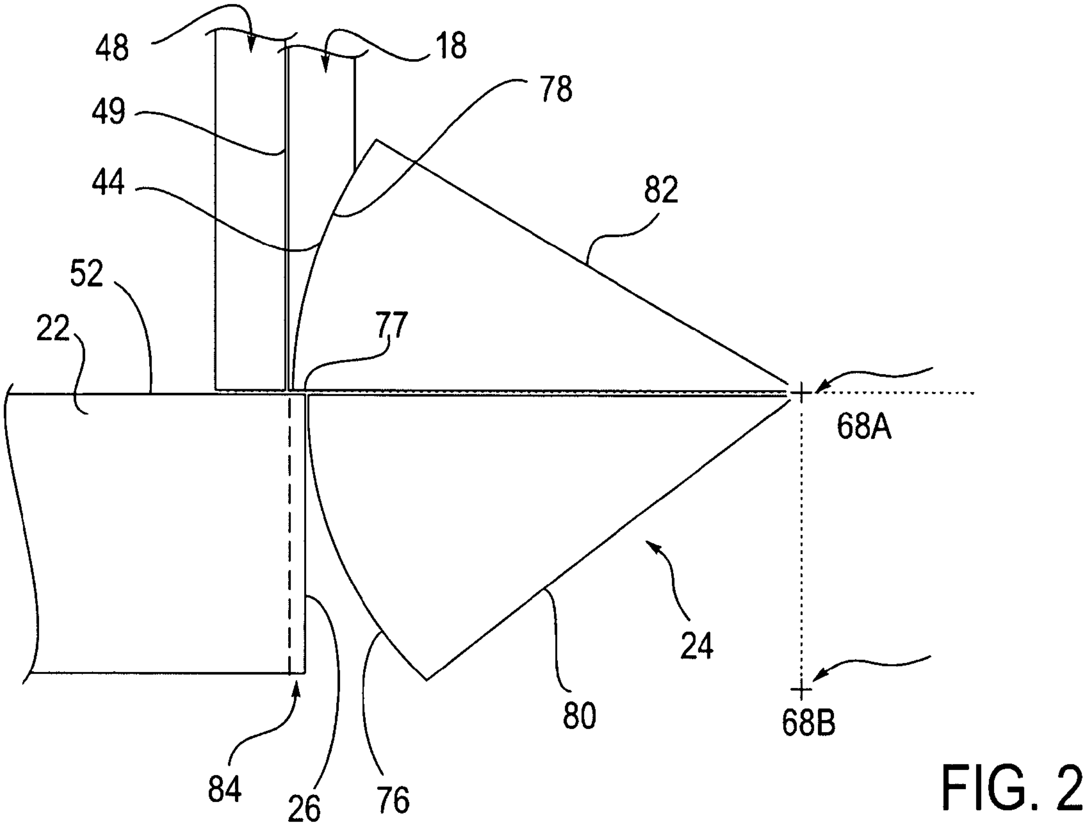
FIG. 2 is an enlarged side elevational view schematically illustrating a blade of the apparatus of FIG. 1 in a first position.

A physical support or backing plate 48 can be used to guide blade 18 during cleaving, especially in the initial stage of cleaving (see FIGS. 1-2). Backing plate 18 can be supported by bearings such as linear bearings 50 which can travel upwardly and downwardly on guide 34. Mounting 47 can be used to couple backing plate 18 to bearings 50. By way of example, backing plate 48 may include a surface 49 substantially perpendicular to a top surface 52 of boule 22 so that backing plate 48 aligns and supports blade 18 during cleaving. Backing plate 48 may also include a lip that extends into a groove to be described in greater detail below.

Figure 3:
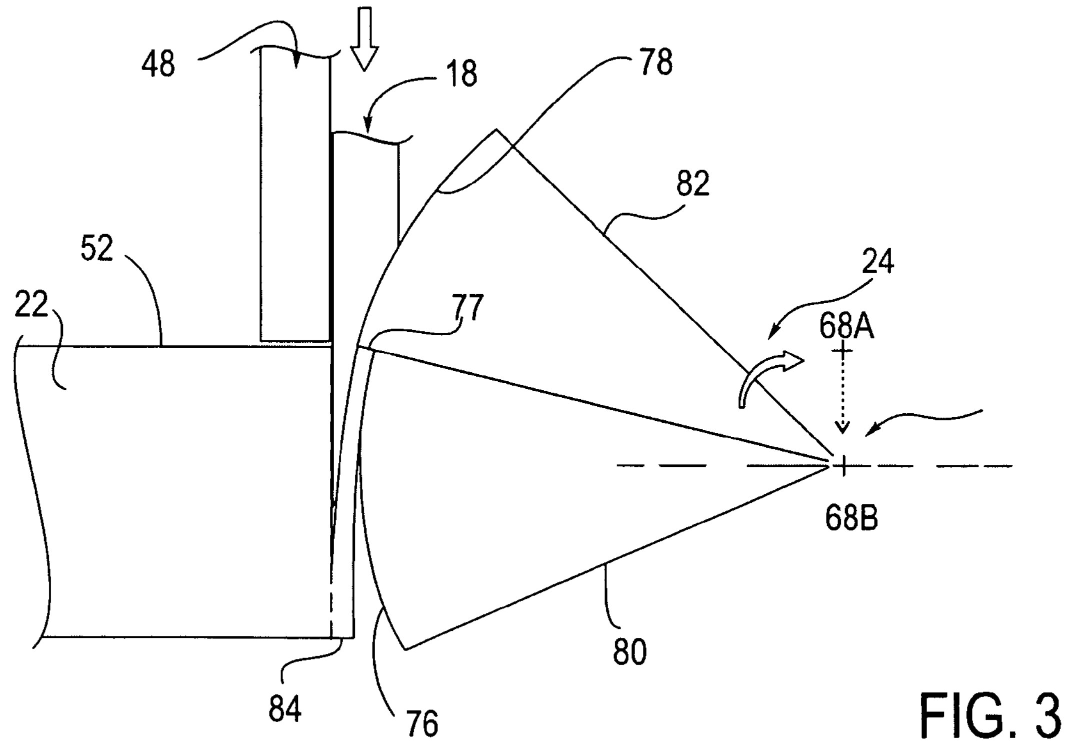
FIG. 3 is a side elevational view schematically illustrating a blade of the portion of the apparatus of FIG. 2 in a second position.

Follower 24 is adapted to engage the end 26 of boule 22 during cleaving. Follower 24 may also function to guide blade 18 during cleaving in a slow and controlled manner. Follower 24 is coupled to an attachment 54 by any suitable means such as a plurality of bolts or other fasteners 55 so as to be rigidly secured to the attachment 54. The attachment 54 is coupled to a follower support assembly 61 by any suitable means and, as shown, is pivotably or rotatably coupled to the assembly 61 by means of a pivot shaft or pin 60 extending through the lower end of a shaft 62. Support assembly 61 includes the shaft 62, an adjustment assembly 64 secured to the upper end of the shaft 62, and a rotation stop adjustment 66 for limiting the angular movement of attachment 54 and follower 24 relative to shaft 62. The adjustment assembly 64 serves to secure the shaft 62 to plate 17 by such as bars 63 and bolts 65 and to allow the shaft 62 to be adjusted in height by bolt 67 so that the axis of rotation of pin 60 is at the point where bending of the slice occurs. The assembly 64 further allows the vertical travel of shaft 62 and thus pin 60 and follower 24 to occur in a path parallel to the blade 18 and in unison with the blade 18. The follower 24 is rotated about pin 60 by some combination of friction between the follower surface 76 and the end surface 26 of boule 22, pressure from the top of the slice on the upper portion of the follower 24, that is surface 77, and/or an explicit drive mechanism such as a pulley mounted on pin 60 with a chain, cable or flexible band affixed to top platen 16, or a pinion gear mounted on pin 60 and a rack gear mounted on base 12, or a suitable motor controlled to rotate pin 60 at the proper time and rate. Friction between surfaces 44 and 78 is controlled by an anti-friction coating on one or both of the surface 44 and 78 and/or sizing the upper portion of follower 24 to fit loosely relative to the blade 18 so as not to bind on the blade 18. As blade 18 advances, adjustment assembly 64 moves downward as well, which moves shaft 62 down. The friction between the follower surface and the end surface 26 of boule 22 causes the attachment 54 and follower 24 to rotate about pin 60. Accordingly, as blade 18 advances, follower 24 moves down and rotates against the cleaved portion of brittle material. As shown in FIGS. 2 and 3, follower 24 rotates about an axis of rotation 68, defined by the axial centerline of pin 60, during cleaving. The location of the pin 60, and thus the axis of rotation 68, moves down from a first position 68A, illustrated in FIG. 2, to a second position 68B, illustrated in FIG. 3, as blade 18 advances.

In one embodiment shown in FIGS. 2-3, follower 24 is a rolling follower having at least one convex curved surface resembling an arc of circle. In a preferred embodiment, follower 24 may include a first convex curved surface 76 adapted to engage end 26 of boule 22, and a second convex curved surface 78 adapted to engage blade 18 during cleaving. A radially extending surface 77 extends from the first convex surface 76 to the second convex surface 78. The radially extending surface 77 is engaged with a portion of the brittle material and has a radius substantially equal to the thickness of the portion of the brittle material. The second convex curved surface 78 may be provided with a curve that approximates the curve of the concave curved surface 44 of blade 18 and it is preferred that surface 78 extend through an arc approximating the length of the arc 44 of the blade 18. The first convex curved surface 76 has a first radius 80 and the second convex curved surface 78 has a second radius 82 that preferably approximates the radius of surface 44. The length of first radius 80 depends on the strength of the material being cleaved and the thickness of the section being cleaved. The length of the arc of surface 76 is preferably long enough to cover the surface of section 84 of the boule 22 over the entire range of travel of the follower 24. The first and second radius 80 and 82 and the thickness of the cleaved portion 84 are selected such that the second convex curved surface 78 engages the concave curved surface 44 of blade 18 while the first convex curved surface 76 engages the cleaved portion 84 of brittle material. By way of example, the first radius 80 is less than the second radius 82 by a difference approximating the thickness of the cleaved portion 84.

Figure 4:
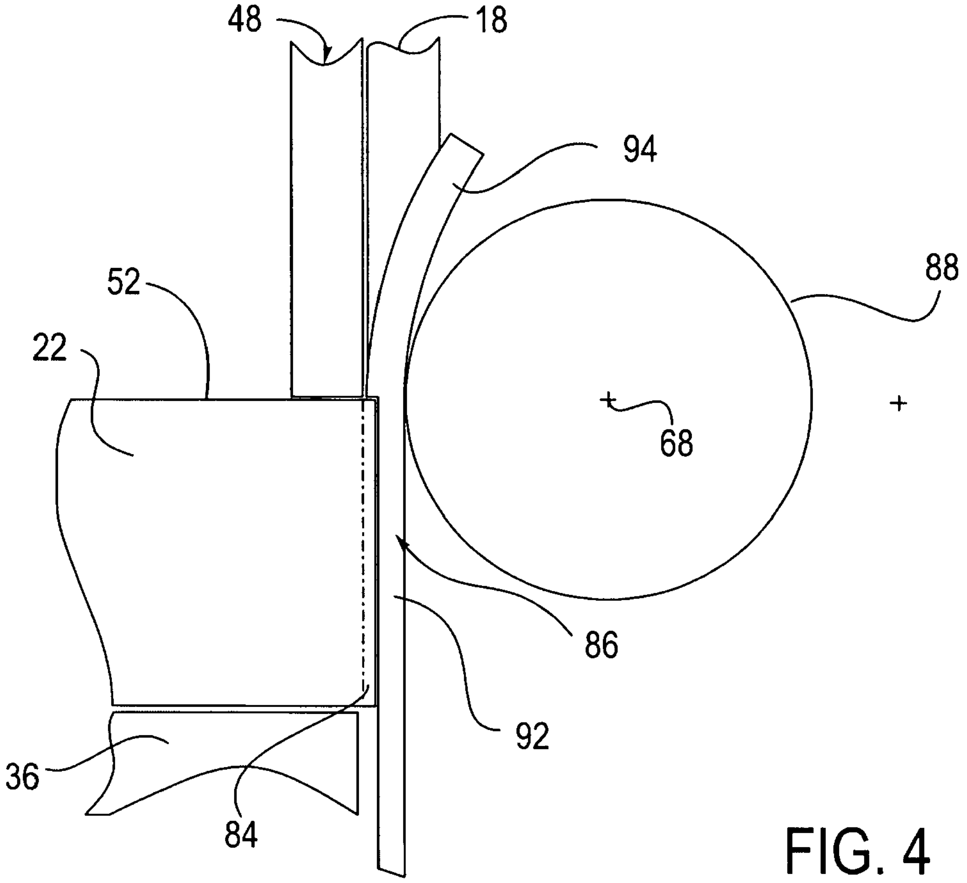
FIG. 4 is a side elevational view, similar to FIG. 2, of another embodiment of the apparatus for cleaving brittle material of the present invention in a first position.
Figure 5:
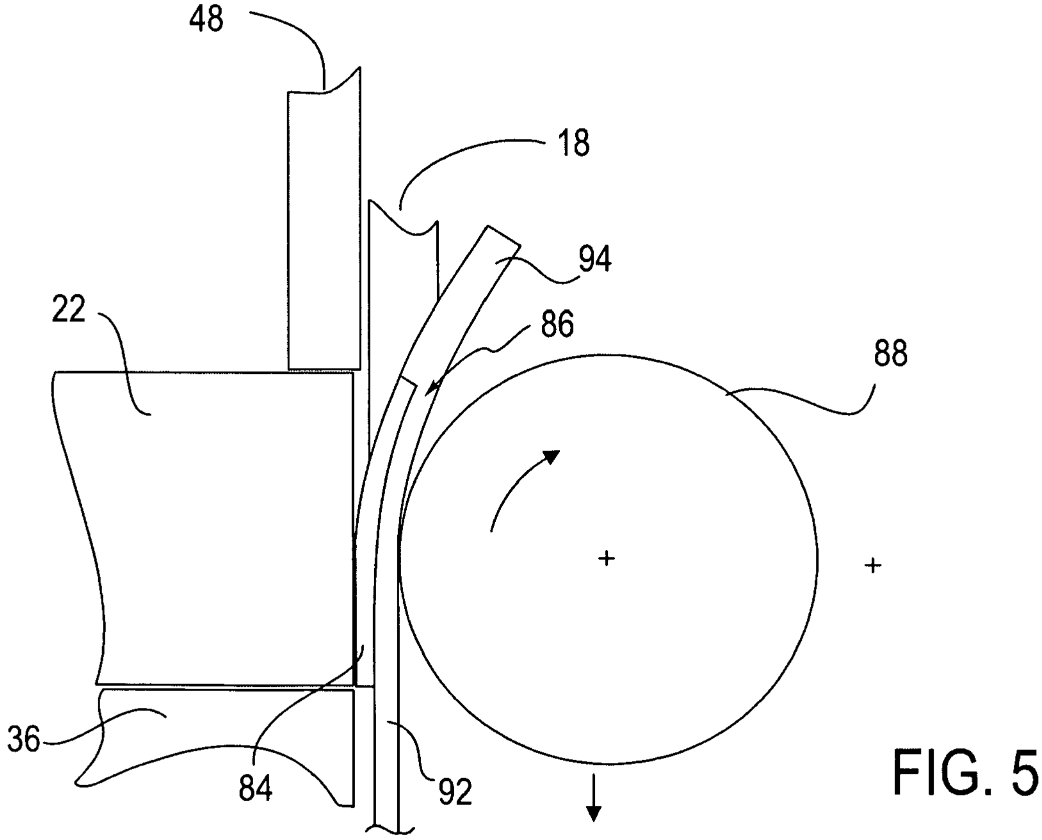
FIG. 5 is a side elevational view, similar to FIG. 3, of the portion of the apparatus of FIG. 4 in a second position.
Figure 6:
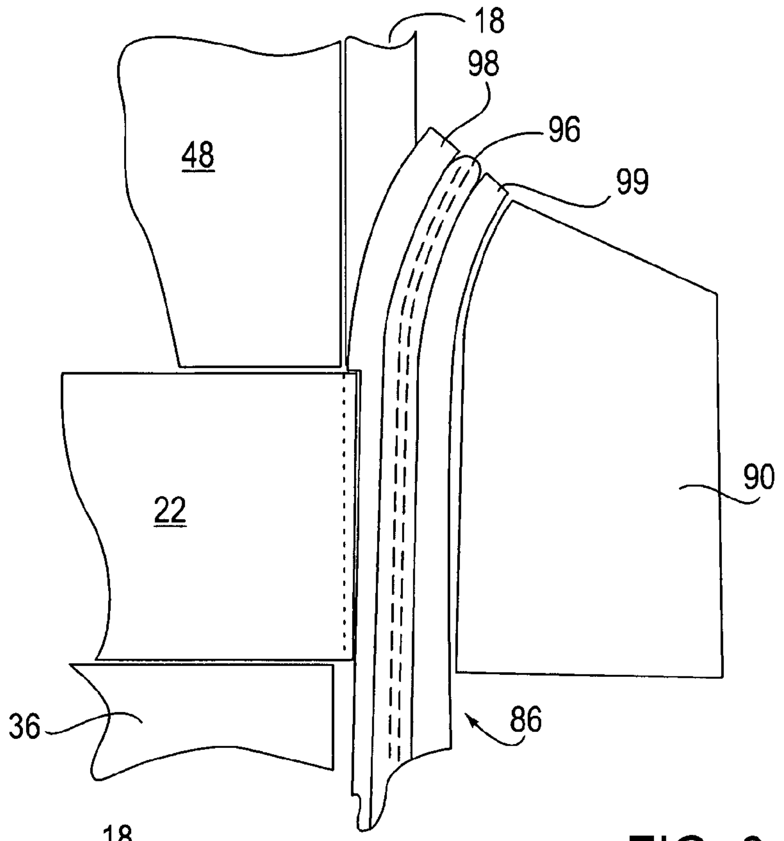
FIG. 6 is a side elevational view, similar to FIG. 2, of a further embodiment of the apparatus for cleaving brittle material of the present invention in a first position.
Figure 7:
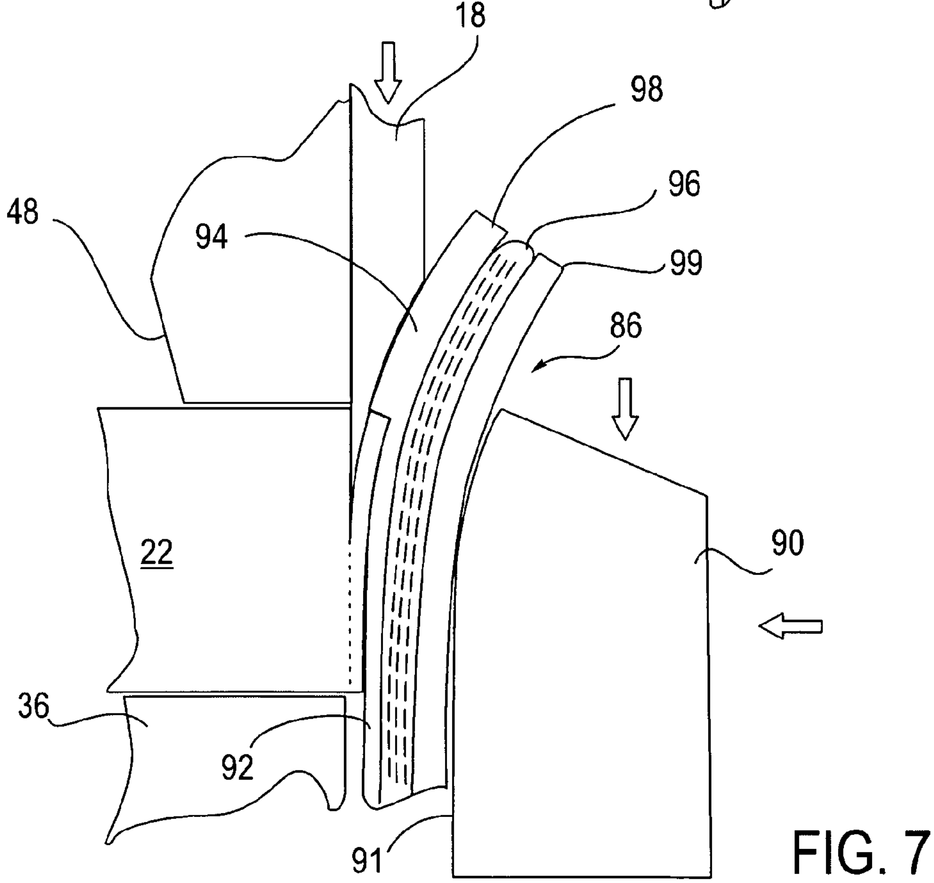
FIG. 7 is a side elevational view, similar to FIG. 3, of the portion of the apparatus of FIG. 6 in a second position.

The follower 24 can have other embodiments and be within the scope of the invention. For example, follower 24 may include a flexible layer or strip 86 and a moveable member that applies a force against strip 86 so as to urge the strip against the boule (see FIGS. 4-5). It will be appreciated that the flexible layer 86 is optional but not required. The moveable member may be of any suitable type, such as a rotatable roller 88, as shown in FIGS. 4-5, or a sliding block 90, as shown in FIGS. 6-7 and described below. Roller 88 is pivotably coupled to the lower end of shaft 62, for example by pin 60, and may be rotatably actuated by friction against strip 86, for example with some rough coating or small gearing between roller 88 and strip 86, so that the roller 88 rotates in a clockwise direction, in FIGS. 4-5, about axis 68 as the roller 88 and blade 18 move downward under the force of actuator 20. Roller 88 may also be actuated by a rack and pinion or band drive (not shown). Flexible strip 86 may have a first portion 92 adapted to engage the cleaved portion 84 of brittle material, and a second portion 94 adapted to engage blade 18. The first portion 92 has a first thickness and the second portion has a second thickness. By way of example, the first thickness is less than the second thickness by a difference approximating the thickness of the cleaved portion 84. As roller 88 moves downward and rotates about axis 68 during cleaving, blade 18 advances and roller 88 presses flexible strip 86 to engage boule 22 and blade 18 to control the outward force on the cleaved portion 84 of the brittle material and keep blade 18 aligned for proper cleaving.

In another embodiment of the present invention, the strip 86 of follower 24 includes a shockwave absorbing layer 96, as shown in FIGS. 6-7, which can be an elastomeric layer that dampens the shockwaves from each successive crack. In some embodiments, an elastomeric layer 96 is sandwiched between first and second flexible sheets such as first and second thin steel sheets 98 and 99. In a preferred embodiment, first sheet 98 is similar to strip 86 illustrated in FIGS. 4-5 and has first and second portions 92 and 94. Alternatively, elastomeric layer 96 may be directly engage boule 22, if the elastomer is sufficiently firm, in which case the elastomeric layer is preferably formed with first and second portions 92 and 94.

A sliding block 90 may be used to apply a force against flexible strip 86 (see FIGS. 6-7). Sliding block 90 moves down as blade 18 descends and is preferably coupled to the lower end of shaft 62 and more preferably rigidly secured to the lower end of the shaft 62. A bearing surface 91 may be provided on block 90 and be formed of a low coefficient of friction plastic for slidably engaging flexible strip 86. Alternatively, a fluid bearing or other commonly used flat bearing, or any other suitable means, may be used for forming the bearing surface 91 of the block 90.

In operation, rod clamp 38 is raised to allow a boule of brittle material 22 to be pushed or moved by a pushing mechanism such as a pushrod 28 to a desired position for cleaving. This pushing may be guided by front and rear boule guides 30 and 32. The position of boule 22 can be adjusted by fine adjustment slide 36. When boule 22 is in a position to be cleaved, its end surface 26 is pushed against follower 24 to an appropriate position relative to blade 18 so as to establish a desired cut depth, that is a desired thickness of the portion of the boule to be cleaved.

Rod clamp motor 40 is then actuated so that rod clamp 38 engages the boule 22 and retains the boule in the desired position for cleaving. If some space between boule 22 and follower 26 is needed or desired to allow for cleavage, fine adjustment slide 36 can be moved back (away from blade 18) to allow for this space. The length and flexibility of rod clamp pushrod 38 allows boule 22 to remain firmly clamped.

Cleave actuator 20 is actuated and drives down blade 18 until a crack is initiated. This may be observable by the force on the blade slacking off. Fine adjustment slide 36 is then moved further back, to allow for the back of blade 18 to travel along the incipient cleave. Blade 18 is now advanced further. As the blade 18 advances, follower adjustment assembly 64 moves downward as well, which moves follower shaft 62 down, rotating the follower on pin 60 by any means described above, thus rotating follower 24.

At the end of the cleaving, the slice may be removed by one of two methods. From above, an affordance such as vacuum tweezers can be used to grasp the slice. Fine adjustment slide 36 moves further back to release the slice, and the slice is withdrawn. From beneath, blade 18 is retracted, then fine adjustment slide moves 36 further back, and the slice is released. A combination of these techniques, or other removal techniques, may also be used.

In another aspect, the present invention provides a method of cleaving a bar of brittle materials. In general, the method comprises initiating a crack in the bar and driving a blade through the bar to remove a portion of the brittle material from the end of the bar.

Figure 8:
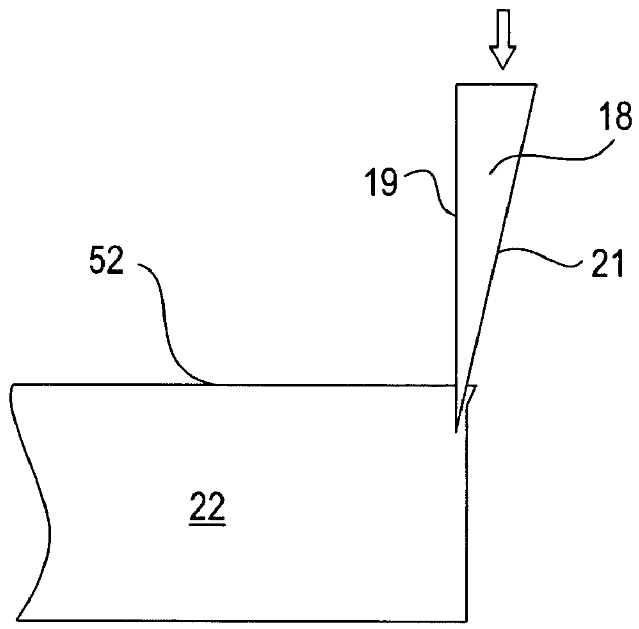
FIG. 8 schematically illustrates the initiation of a cleaving process in accordance with one method of the present invention.

A cleaving process where blade 18 cleaves a bar of brittle material 22 according to an embodiment of the present invention is illustrated in FIG. 8. In this embodiment, cleaving blade 18 impacts the brittle material at a crystal plane, preferably a weak crystal plane. For instance, it is known that for silicon, the (111) plane is the weakest, with the (110) plane nearly as good.

The cleaving proceeds through the brittle material at a controlled speed. Rapid crack propagation may deviate from the intended fracture plane, typically resulting in a series of small, incremental cracks. Cleaving blade 18 should be hard enough, strong enough, and shaped appropriately to peel the intended sheet of material from the bar of the material.

In some embodiments, the back side or surface 19 of blade 18 facing the main portion of bar 22 is substantially perpendicular to the plane of cleavage, which is parallel to top surface 52 of the boule, so there is little or no force acting on the blade to push it into the slice being cleaved. The other side or opposite surface 21 of the blade is, in preferred embodiments, angled enough to be strong enough to withstand the forces, but not too much or the slice being cleaved experiences excessive bending and breaks.

Figure 9:
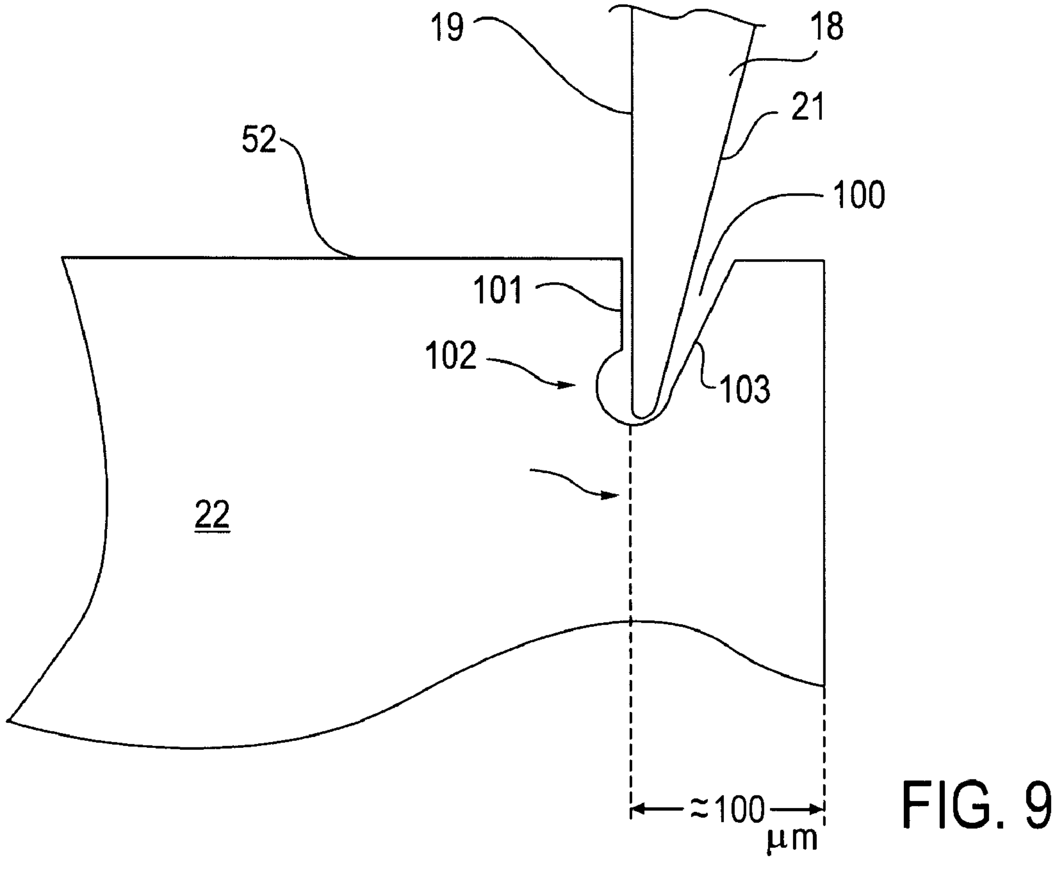
FIG. 9 schematically illustrates the initiation of a cleaving process in accordance with another method of the present invention.

To establish a proper starting point for the cleavage, a groove 100 is preferably formed in bar 22 to be cleaved, as shown in FIG. 9. Groove 100 can be used to position blade 18 so a crack can form under surface 19 of blade 18 facing the bulk of the brittle material, preventing or minimizing outward bending of the blade, which may cause the cleave to diverge and ruin the slice. The starting groove also lessens the pressure on the very tip of the blade, reducing the strength requirements and increasing blade (sharpness) lifetime.

Figure 10:
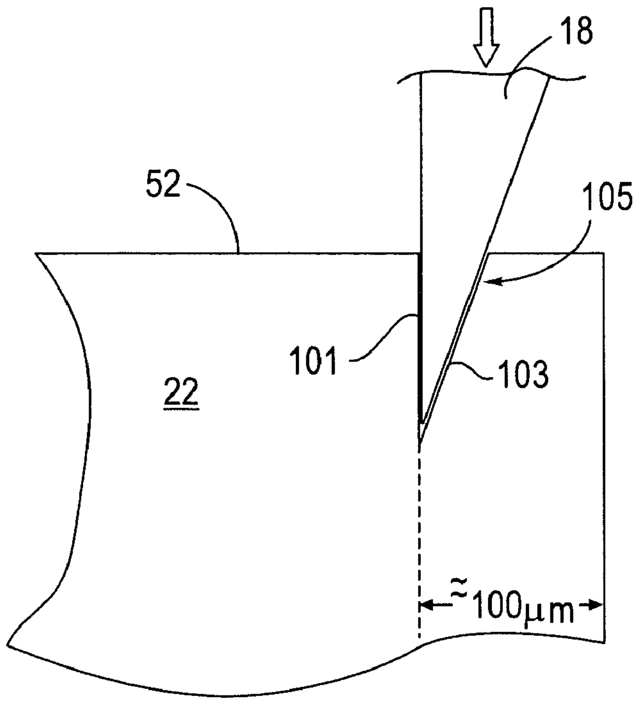
FIG. 10 schematically illustrates the initiation of a cleaving process in accordance with a further method of the present invention.

In some embodiments, the starting groove can be formed from a vertical surface 101 facing the end of the bar being cleaved and a slanted surface 103 facing the bulk of the bar. It may take the form of a sharp notch, a V-shape, or a "keyhole" notch. The "keyhole" notch 100 shown in FIG. 9 has an enlarged bottom or relief 102 so the crack starts under the vertical side. The sharp notch 105 shown in FIG. 10 relies on stress concentration at the sharp point of the notch to start the crack under the vertical side. The notches of the present invention may be mechanically, chemically or otherwise created. For example, the desired shape of the starting grooves can be created either by a diamond tool or by reactive ion etching.

In addition to the starting grooves on the top surface of the bar, it may be helpful to groove the sides and bottom of the bar to help guide the crack more reliably.

Figure 11A:
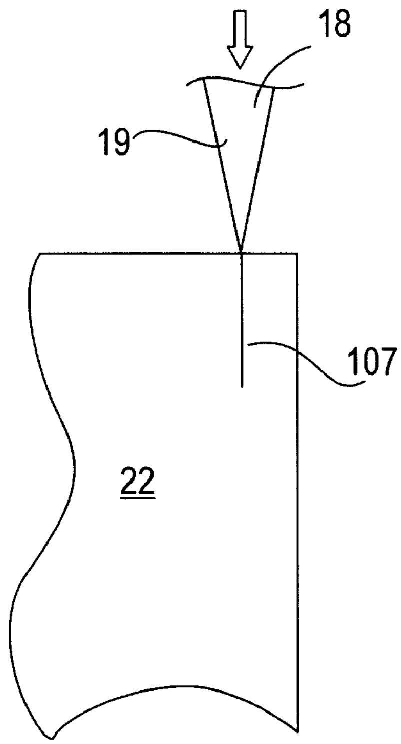
FIG. 11A schematically illustrates a blade in a first position during the initiation of a cleaving process in yet another method of the present invention.
Figure 11B:
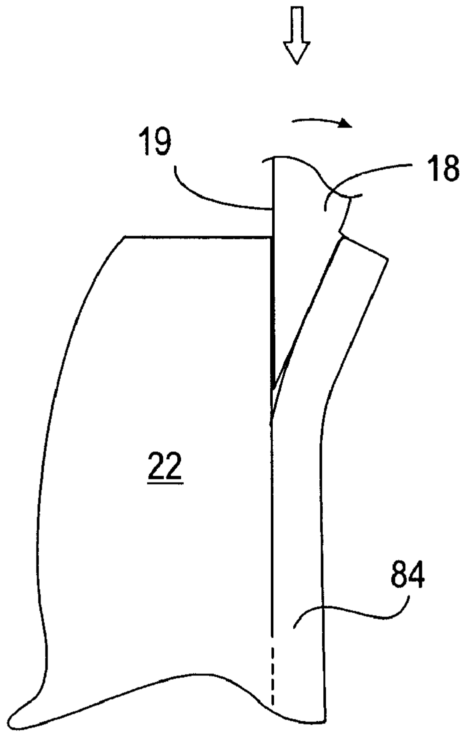
FIG. 11B schematically illustrates a blade in a second position in the cleaving process referred to in FIG. 11A.

An embodiment of the present invention where blade 18 is adjusted after a crack 107 is initiated in bar 22 is illustrated in FIGS. 11A-11B. In this embodiment, blade 18 has a symmetric V-shape that is used to maximize the strength of the blade for starting the crack. After the crack is created, blade 18 is leaned or tilted towards the end of bar 22, as shown in FIG. 11B, so that the blade surface 19 facing the bulk of brittle material is parallel to the rod surface 26.

In some embodiments of the present invention, grooves 100 formed in bar 22 are spaced 50 to 100 microns apart. The starting groove 100 is aligned under blade 18 and the bar 22 is then clamped in place. Force is thereafter applied to blade 18. When the cleaved slice separates, it is picked up in any suitable manner, for example in some embodiments by a suction wand or gas jets. The process is repeated until bar 22 is too short to support further cleaving. Another bar can then be positioned for cleaving.

Figure 12A:
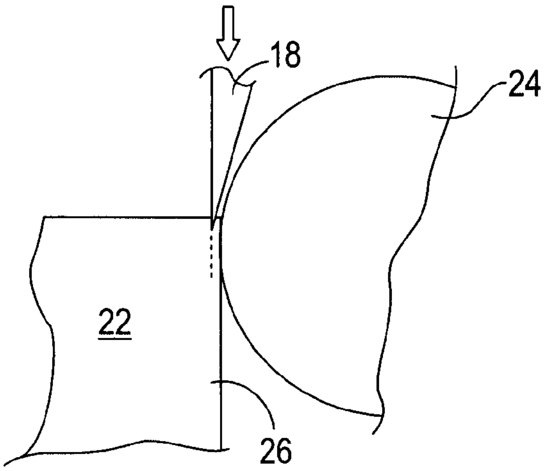
FIG. 12A is a side elevational view, similar to FIG. 2, of another embodiment of the apparatus for cleaving brittle material of the present invention in a first position.
Figure 12B:
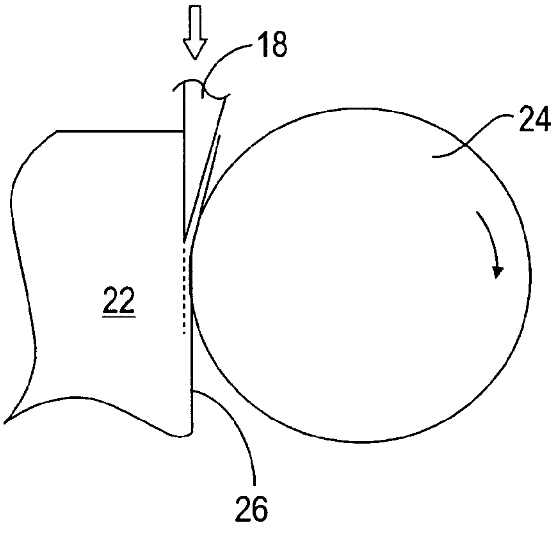
FIG. 12B is a side elevational view, similar to FIG. 3, of the portion of the apparatus of FIG. 12A in a second position.
Figure 15:
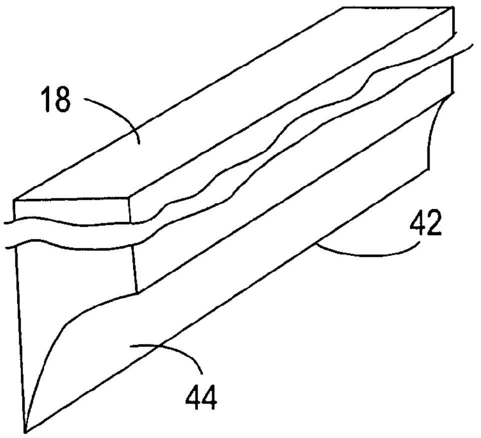
FIG. 15 is an enlarged perspective view schematically illustrating a blade in accordance with an embodiment of the present invention.
Figure 13A:
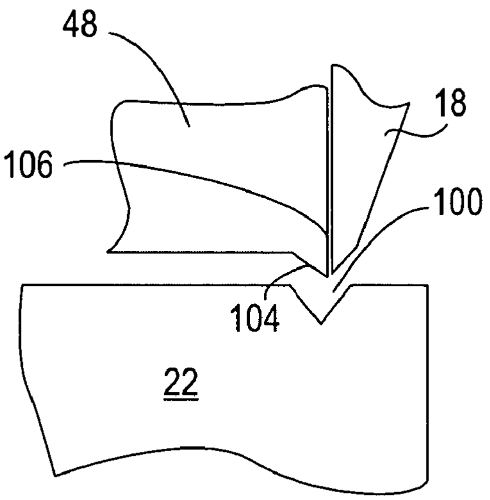
FIG. 13A schematically illustrates a groove, a blade and a backing plate for cleaving a brittle material in accordance with a method of the present invention.
Figure 13B:
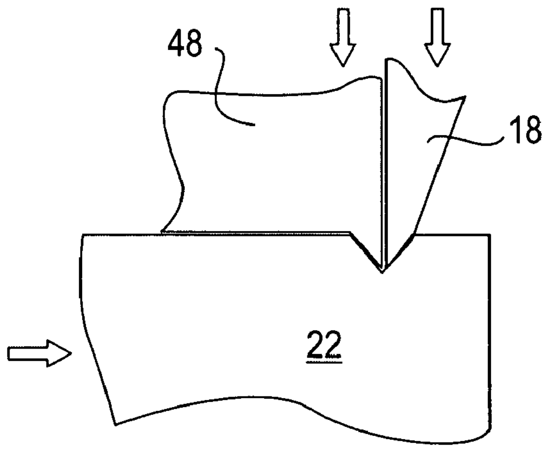
FIG. 13B schematically illustrates the initiation of a cleaving process in accordance with a method of the present invention.
Figure 13C:
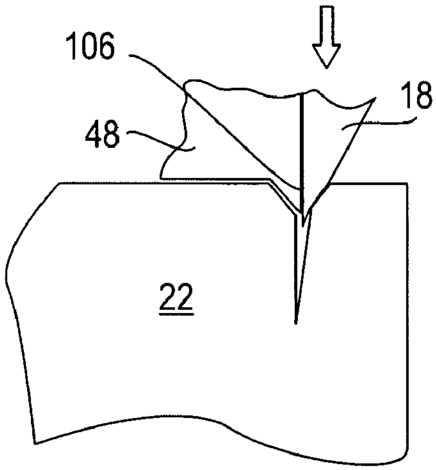
FIG. 13C schematically illustrates the propagation of the crack initiated in the step illustrated in FIG. 13B in accordance with a method of the present invention.
Figure 13D:
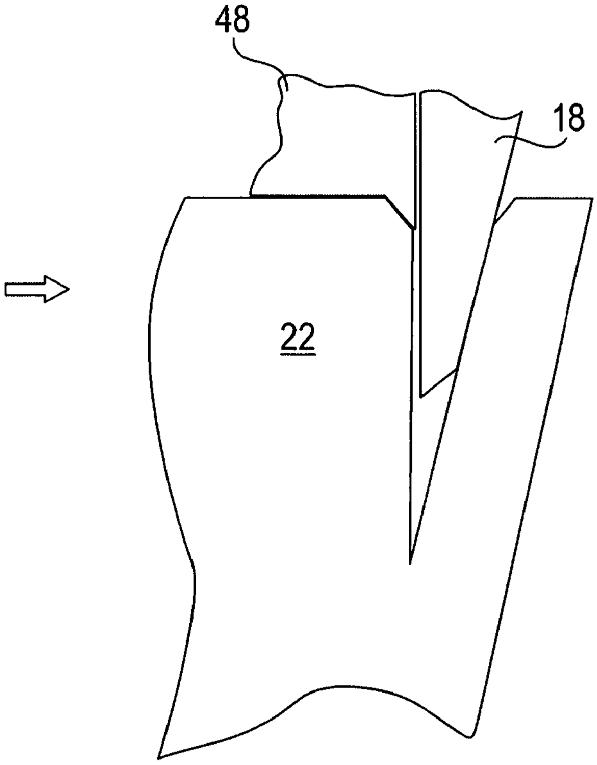
FIG. 13D schematically illustrates the propagation of the cleaving process in accordance with a method of the present invention.

An embodiment of the present invention where a follower 24 engages the end 26 of bar 22 to limit outward force on the cleaved part of slice is illustrated in FIG. 12. Follower 24, which includes any suitable movable member such as roller 88, also guides blade 18 during cleaving in a slow and controlled manner. The roller 88 supports the cleaved material at the point of cleaving to limit force away from the body of bar 22 and to assist in preventing the slice from cracking or breaking.

In another embodiment of the present invention, a physical support or backing plate 48 is used for guiding blade 18 (see FIGS. 13A-13D. In this regard, when V-shaped grooves are formed in bar 22, backing plate 48 may include a depending lip 104 that extends into the groove 100, that is preferably V-shaped, to provide a temporary vertical surface 106. The temporary vertical surface 106 aligns blade 18 with the sharp point forming the bottom of the V-shaped grooves 100. Backing plate 48 supports the blade 18 when blade 18 descends.

In some embodiments, corrosive agents can be applied to the groove and/or crack that preferentially breaks the strained bonds of brittle material. Thus, corrosive agents can be used to reduce the force required and to allow the crack speed to be limited to much less than the speed of sound, resulting in more controllable cracks. Any suitable corrosive agents can be used. For example, potassium hydroxide (KOH) solution can be used as a corrosive agent for silicon. Alternatively, an electrochemical action can be used to break the strain bonds of brittle material. This can be accomplished with a conductive layer embedded in the blade.

In a further embodiment of the present invention, the position of blade 18 may be adjusted or shifted after a crack is initiated. As shown in FIGS. 14A-14D, a crack may be formed along a line 110 different from the imaginery line 112 extending downwardly into the bar 22 under the vertical surface of blade 18. After the crack is created and the blade penetrates the bar 22, blade 18 can be shifted slightly toward the slice as shown in the transition between FIG. 14B to FIG. 14C so that when it continues its downward path, blade 18 does not press outwards.

The present invention has been described with various embodiments and methods where a thin section of brittle material is cleaved starting from one end of a bar of brittle material. It will be appreciated that the present invention also applies to cleaving by halves, in which a rod is successively cleaved in halves along a path perpendicular to a longitudinal axis 21 of the boule 22 (see FIG. 1). As the halves get very thin, they are too weak to support cleaving by conventional means. A first follower can be used to engage one end surface of the thin halve and a second follower can be used to engage the opposite end of the thin halve. The blade, follower, and grooves as described above are equally applicable in the latter stages of cleaving in halves, enabling much thinner sections than achievable solely with conventional cleaving.

In one aspect of the invention, an apparatus for cleaving a section of a bar of brittle material having an end can be provided and include a support adapted to hold the section of the bar in a position to be cleaved, a blade, an actuator coupled to the blade for driving the blade at least partially through the bar to create a cleaved portion of the bar and a follower for engaging the end of the bar during cleaving.

The blade can have a leading edge and a concave curved surface extending away from the leading edge. The concave curved surface of the blade can be provided with a curve and the follower can have a convex curved surface provided with a curve approximating the curve of the concave curved surface of the blade. The follower can have an additional convex curved surface, and a radially extending surface can extend from the first-named convex curved surface to the additional convex curved surface. The cleaved portion of the bar can have a thickness and the first-named convex curved surface can have a first radius and the additional convex curved surface can have a second radius that is less than the first radius by a difference approximating the thickness of the cleaved portion of the bar. The cleaved portion of the bar can have a thickness, and the follower can include a movable member and at least one layer of material secured to the movable member, the at least one layer of material having a first portion provided with a first thickness and a second portion provided with a second thickness that is less than the first thickness by a difference approximating the thickness of the cleaved portion of the bar. The movable member can have a member rotatable about an axis of rotation. The actuator can drive the blade in a direction of travel, and the movable member can be a member translatable in a direction parallel to the direction of travel of the blade. The at least one layer of material can include an elastomeric layer. The end of the bar can have a planar surface extending transversely of the bar, and the follower can include a planar surface extending from the convex curved surface and parallel to the planar surface of the end of the bar.

In another aspect of the invention, an apparatus for cleaving a section of a bar of brittle material can be provided and include a support adapted to hold the section of the bar in a position to be cleaved, a blade having a leading edge and a concave region extending away from the leading edge and an actuator coupled to the blade for driving the blade at least partially through the bar to create a cleaved portion of the bar. The concave region can be formed from a concave curved surface.

In another aspect of the invention, a cleaving apparatus can be provided and include a bar of brittle material having a section to be cleaved, a support for holding the section of the bar in a position to be cleaved, a blade and an actuator coupled to the blade for driving the blade at least partially through the bar to create a cleaved portion of the bar. A follower for engaging the end of the bar during cleaving can be included.

In another aspect of the invention, a method of cleaving a bar of brittle material having an end can be provided an include initiating a crack in the bar and driving a blade through the bar to remove a portion of the brittle material from the end of the bar.

The driving step can include driving the blade through the bar at a controlled speed. The initiating step can include initiating the crack a distance ranging from 50 to 200 microns from the end of the bar. The brittle material can include a crystalline material. The brittle material can be selected from the group of materials consisting of silicon, gallium arsenide, germanium, silicon-germanium and sapphire. The initiating step can include driving the blade into the bar of brittle material. The method can further include guiding the blade along a physical support prior to driving the blade into the bar to initiate the crack. The method can further include aligning the blade with the crack prior to driving the blade along the crack. The method can further include forming a groove in a surface of the bar prior to the initiating step. The forming step can include forming the groove along a crystal plane of the brittle material. The groove can be provided with a surface extending substantially perpendicular to a surface of the bar. The groove can be a keyhole groove. The method can further include guiding the blade along a physical support, at least a portion of the physical support extending into the groove to provide a guiding surface substantially perpendicular to a surface of the bar. The method can further include applying a force against the end of the bar. The applying step can include moving a follower member along the end of the bar.

One of the advantages of the apparatus and method provided by the present invention is that brittle materials can be cleaved into thin sections without saw waste.

From the foregoing it will be appreciated that, although specific embodiments of the invention have been described herein for purposes of illustration, various modifications may be made without deviating from the spirit and scope of the invention.

What is claimed is:

1. A method of cleaving a bar of brittle material having a surface and an end comprising forming a starting groove in the surface in a cleavage plane adjacent the end of the bar, initiating a crack in the bar using the starting groove, driving a blade entirely through the bar to repetitively advance the crack through the bar and form a cleaved slice of brittle material from the bar, and supporting the cleaved slice by means of a support following blade motion to prevent fracture of the cleaved slice.

2. The method of claim 1, wherein the driving step includes driving the blade through the bar at a controlled speed.

3. The method of claim 1, wherein the brittle material includes a crystalline material.

4. The method of claim 1, wherein the brittle material is selected from the group of materials consisting of silicon, gallium arsenide, germanium, silicon-germanium and sapphire.

5. The method of claim 1, wherein the initiating step includes contacting the bar of brittle material with the blade.

6. The method of claim 5, further comprising guiding the blade along a physical support prior to the initiating step.

7. The method of claim 6, further comprising aligning the blade with the crack prior to driving the blade along the crack.

8. The method of claim 1, wherein the starting groove is provided with a cleaving surface spaced from the end of the bar of brittle material and perpendicular to the surface of the bar.

9. The method of claim 1, wherein the starting groove is a keyhole groove.

10. The method of claim 1, further comprising guiding the blade along a physical support, wherein at least a portion of the physical support extends into the groove to provide a guiding surface substantially perpendicular to the surface of the bar.

11. The method of claim 1, wherein the support following blade motion comprises a follower member and the supporting step includes moving the follower member relative to the end of the bar.

12. The method of claim 1, further comprising applying a corrosive agent in the starting groove for breaking strained bonds of the brittle material.

13. The method of claim 1, further comprising forming a plurality of starting grooves in the bar of brittle material and wherein the initiating step includes initiating a crack in at least one of the plurality of starting grooves.

14. The method of claim 1, in which each of the blade and the support following blade motion has a curved surface for engaging the cleaved slice.

15. The method of claim 14, wherein the cleaved slice of brittle material bends during the driving step.

16. The method of claim 14, wherein the slice bends over a radius corresponding to a blade radius and a support radius.

17. The method of claim 1, wherein the blade is driven through the bar of brittle material a distance that correlates to a width of the brittle material.

18. The method of claim 1, further comprising applying a corrosive agent in the crack for breaking strained bonds of the brittle material.

19. The method of claim 1, wherein the starting groove is substantially V-shaped and the initiating step includes forcing a pair of blades into the V-shaped groove to initiate the crack.

20. The method of claim 1, wherein the supporting step includes supporting the cleaved slice with a curved surface as the cleaved slice bends during cleaving of the bar.

21. A method of cleaving a bar of brittle material having an end comprising contacting the bar with a blade to initiate a crack in the bar, aligning the blade with the crack to provide an aligned blade and driving the aligned blade through the bar to remove a portion of the brittle material from the end of the bar.

22. The method of claim 21, wherein the contacting step includes guiding the blade along a physical support.

23. The method of claim 21, further comprising supporting the portion of brittle material removed from the end of the bar by means of a support following blade motion to prevent fracture of the portion removed.

24. The method of claim 23, in which each of the blade and the support has a curved surface for engaging the portion of the brittle material removed from the end of the bar.

25. The method of claim 21, wherein the driving step includes incrementally driving the blade through the bar at a controlled speed.

26. A method of cleaving a bar of brittle material having an end comprising forming a keyhole groove in a surface of the bar, initiating a crack in the bar commencing from the keyhole groove and driving a blade through the bar to remove a portion of the brittle material from the end of the bar.

27. The method of claim 26, further comprising supporting the portion of brittle material removed from the end of the bar by means of a support following blade motion to prevent fracture of the portion removed.

28. The method of claim 27, in which each of the blade and the support has a curved surface for engaging the portion of the brittle material removed from the end of the bar.

29. The method of claim 26, wherein the driving step includes incrementally driving the blade through the bar at a controlled speed.

30. A method of cleaving a bar of brittle material having an end comprising forming a groove in a surface of the bar, initiating a crack in the bar commencing from the groove, providing a physical support having a portion that extends into the groove and has a guiding surface that is substantially perpendicular to the surface and driving a blade along the guiding surface and through the bar to remove a portion of the brittle material from the end of the bar.

31. The method of claim 30, further comprising supporting the portion of brittle material removed from the end of the bar by means of a support following blade motion to prevent fracture of the portion removed.

32. The method of claim 31, in which each of the blade and the support has a curved surface for engaging the portion of the brittle material removed from the end of the bar.

33. The method of claim 30, wherein the driving step includes incrementally driving the blade through the bar at a controlled speed.

34. A method of cleaving a bar of brittle material having an end comprising driving a blade through the bar to form a cleaved slice from the bar and engaging the end of the bar with a curved surface during cleaving to support the cleaved slice as the cleaved slice bends away from the blade during cleaving.

35. The method of claim 34, further comprising pivoting the curved surface while the blade is being driven through the bar.

36. The method of claim 35, wherein the blade travels in a direction while being driven through the bar and wherein the curved surface pivots about a pivot point during the pivoting step, further comprising moving the pivot point in a direction parallel to the direction of travel of the blade while the blade is being driven through the bar.

37. The method of claim 34, wherein the blade travels in a direction while being driven through the bar, further comprising moving the curved surface in a direction parallel to the direction of travel of the blade while the blade is being driven through the bar.

* * * * *